(12) United States Patent
Kim et al.

(10) Patent No.: US 6,268,273 B1
(45) Date of Patent: Jul. 31, 2001

(54) FABRICATION METHOD OF SINGLE ELECTRON TUNNELING DEVICE

(75) Inventors: Byong-man Kim; Jo-won Lee, both of Kyungki-do; Mi-young Kim, Kangwon-do; Moon-kyoung Kim, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/714,512

(22) Filed: Nov. 17, 2000

(30) Foreign Application Priority Data

May 6, 2000 (KR) ................................ 00-24212

(51) Int. Cl.[7] ...................... H01L 21/4763; H01L 21/283
(52) U.S. Cl. .......................... 438/594; 438/927; 438/962; 438/979
(58) Field of Search ..................... 438/191–198, 438/167–169, 594, 927, 962, 979, 263–264

(56) References Cited

U.S. PATENT DOCUMENTS 5,589,692 * 12/1996 Reed ...................................... 257/23
5,763,933 * 6/1998 White ................................... 257/528

* cited by examiner

*Primary Examiner*—Jey Tsai
(74) *Attorney, Agent, or Firm*—Burns, Doane, Swecker & Mathis

(57) ABSTRACT

A method of fabricating a single electron tunneling (SET) device, the method including forming a source electrode and a drain electrode a predetermined distance apart from each other on an insulating substrate, forming a metal layer having a thickness on the order of nanometers between the source and drain electrodes, and forming quantum dots between the source and drain electrodes due to the movement of metal atoms/ions within the metal layer caused by applying a predetermined voltage to the source and drain electrodes. In the manufacture of an SET device, quantum dots can be formed by a simple method instead of an self assembled monolayer (SAM) method or lithographic methods. Thus, SET devices fabricated in this way have no material dependency, and are also applicable to large scale integration (LSI) structures. Also, since quantum dots are obtained by deposition and electromigration, SET devices having the above-described advantages can be mass-produced.

4 Claims, 6 Drawing Sheets

FABRICATION METHOD OF SINGLE ELECTRON TUNNELING DEVICE

BACKGROUND OF THE INVENTION

1. Field of the Invention

The present invention relates to a method of fabricating a single electron tunneling (SET) device, and more particularly, to a method of fabricating a SET device using the electromigration induction effect.

2. Description of the Related Art

SET devices, which apply the movement of single electrons between two electrodes, are applied to sensors, diodes, transistors and others. For example, in a SET transistor, as shown in FIG. 1, a drain electrode 2 and a source electrode 3 are installed opposite to each other at an interval of several hundreds of nanometer on an insulating substrate 1. A plurality of nano-sized quantum dots 4 exist on an electron transferring area between the drain and source electrodes 2 and 3, and a gate electrode 5 is located near the electron transferring area. In a transistor having such a structure, when the gate electrode 5 is electrically in a floating state (that is, 0V), the transistor acts as a diode.

In a transistor having such a structure, a threshold voltage Vt due to a coulomb gap where the movement of electrons starts exists between the drain and source electrodes 2 and 3. Accordingly, as shown in FIG. 2, when a gate voltage Vg is 0V, that is, when an SET transistor acts as a diode, the movement of electrons does not start until a voltage $V_{DS}$, which is greater than the threshold voltage Vt, is applied between the drain and source electrodes 2 and 3. At a voltage that is equal to or less than the threshold voltage, a current $I_{DS}$ is theoretically 0 Å. At a voltage that is greater than the threshold voltage, a voltage-to-current has a linear characteristic.

A coulomb gap is controlled by a gate voltage Vg, as shown in FIG. 3. If a gate voltage is 0V, a coulomb gap given to a device itself is maintained, as described referring to FIG. 2. When a gate voltage increases to Vg1 or Vg2 within a predetermined range, a coulomb gap is narrowed. Thus, a threshold voltage at which a transistor operates is reduced.

The above-described SET device, which is several hundreds of nanometers in size, is manufactured by a self assembled monolayer (SAM) method or a nanolithography method. An SET device manufactured by the SAM method is suitable for a large scale integration (LSI) structure, but has a high material dependency. Thus, this SET device is limited in its application. An SET device manufactured by nanolithography has no material dependency, but formation of nano-sized quantum dots is difficult because of the fine pattern formation limit of a lithographic method. Therefore, it is actually impossible that this SET device is applied to LSI structures.

Quantum dots can be formed by electron beam ions on the basis of a method which overcomes the aforementioned limits of the SAM method and the nanolithography method. However, this is not suitable for mass production.

SUMMARY OF THE INVENTION

An objective of the present invention is to provide a method of fabricating a single electron tunneling (SET) device, by which the SET device can be mass-produced.

Another objective of the present invention is to provide a method of fabricating a single electron tunneling (SET) device, which is suitable for large scale integration (LSI) structures.

To achieve the above objectives, the present invention provides a method of fabricating a single electron tunneling (SET) device, the method including: forming a source electrode and a drain electrode a predetermined distance apart from each other on an insulating substrate; forming a metal layer having a thickness on the order of nanometers to maintain a predetermined interval between the source and drain electrodes; and forming quantum dots between the source and drain electrodes due to the movement of metal atoms/ions within the metal layer caused by applying a predetermined voltage to the source and drain electrodes.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENT

Figure 1:
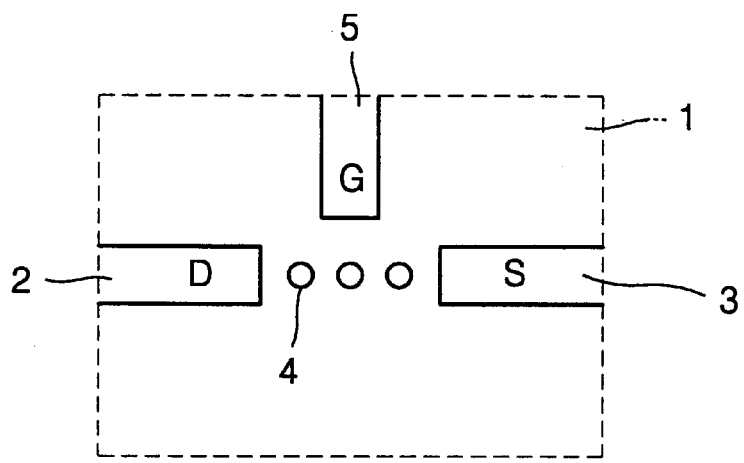
FIG. 1 is a schematic view of a single electron tunneling (SET) transistor, which is a type of SET device.
Figure 2:
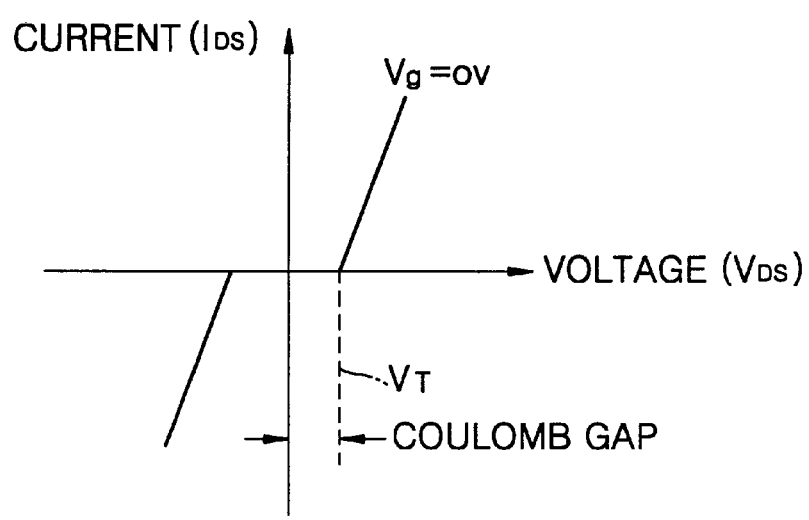
FIG. 2 is a line diagram illustrating the current-to-voltage (I-V) characteristic of an SET device in a diode state where a gate voltage is 0V.
Figure 3:
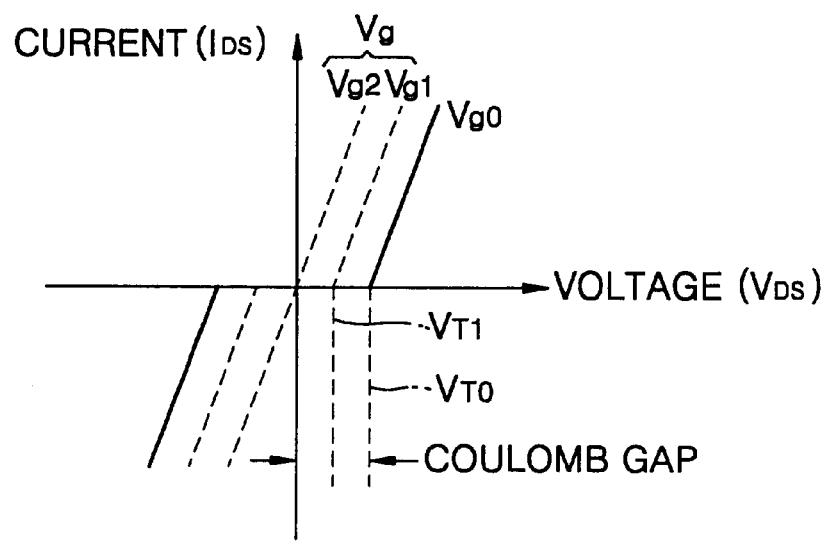
FIG. 3 is a line diagram illustrating the current-to-voltage (I-V) characteristic of an SET device according to a variation in gate voltage (Vg)
Figure 4:
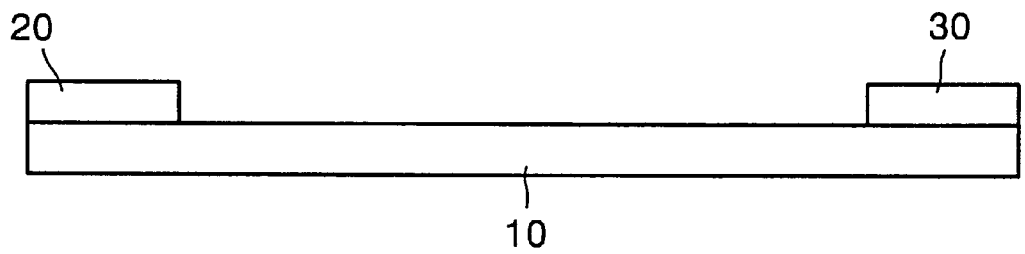
FIG. 4 is a cross-sectional view of an insulating substrate on which a source electrode and a drain electrode are formed, in a process for fabricating an SET device according to the present invention.

In a method of fabricating a single electron tunneling (SET) device, according to the present invention, first, a source electrode 20 and a drain electrode 30 are formed on an insulating substrate 10 which is formed of SiO$_2$ or the like, as shown in FIG. 4. Here, the source and drain electrodes 20 and 30 are each formed to a thickness of about 30 to 40 nm at a distance of about 300 nm apart from each other by photolithography.

Figure 5:
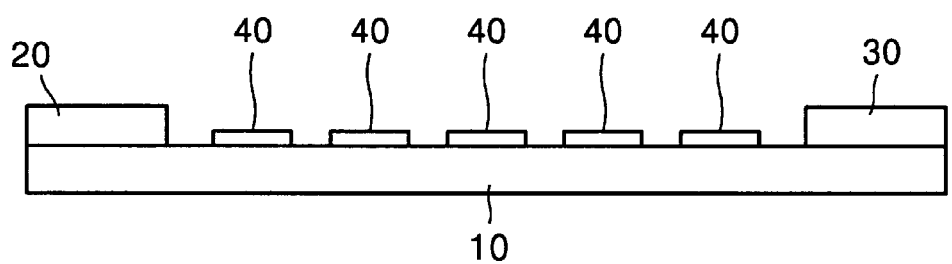
FIG. 5 is a cross-sectional view of a metal layer in a grain state formed between the source and drain electrodes, in a process for fabricating an SET device according to the present invention.

As shown in FIG. 5, a plurality of metal layers 40 in a grain state are formed to a thickness on the order of nanometers between the source and drain electrodes 20 and 30. Here, the metal layers 40 are formed by a deposition method. Also, the metal layers 40 are formed simultaneously, and isolation of the metal layers 40 between the source and drain electrodes 20 and 30 must be controlled during deposition of a metal. In particular, the deposition time must be controlled so that the metal layers 40 have predetermined sizes. That is, deposition of a metal layer is performed at a very slow speed and simultaneously for a short period of time, thereby obtaining metal layers like tiny islands in a grain state not in a single thin film state.

Figure 6:
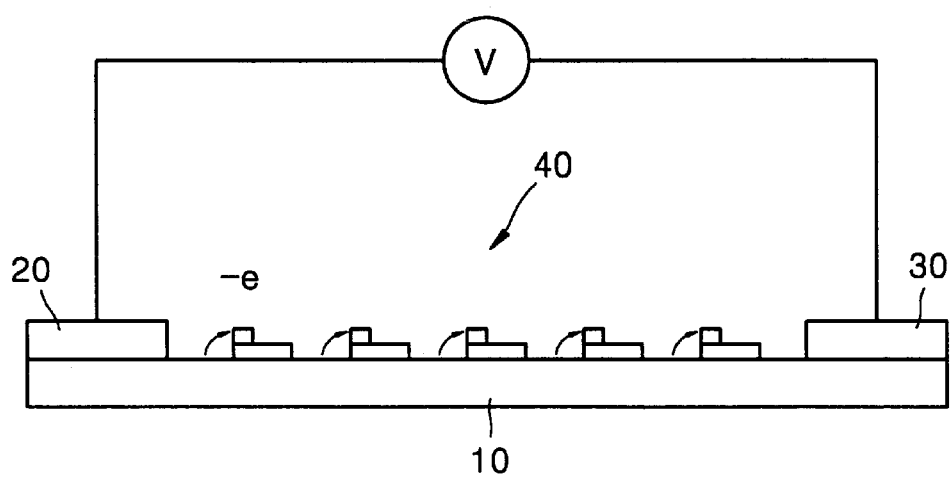
FIG. 6 is a process view illustrating a process in which quantum dots are produced due to the movement of electrons by applying a predetermined potential of voltage to the source electrode and the drain electrode on the insulating substrate, in a method of fabricating an SET device according to the present invention.

As shown in FIG. 6, a predetermined potential of voltage is applied to the source and drain electrodes 20 and 30 to induce the movement of metal atoms/ions between the metal layers 40, so that quantum dots are formed from the metal layers 40. Here, the predetermined voltage is greater than a threshold voltage between the source and drain electrodes 20 and 30.

Through the above-described process, quantum dots can be successfully formed, since current electromigration (EM) occurs between the metal layers 40 due to application of a predetermined voltage to the source and drain electrodes 20 and 30. Accordingly, stabilized and uniformly-distributed quantum dots can be obtained by surface energy minimization.

Figure 7:
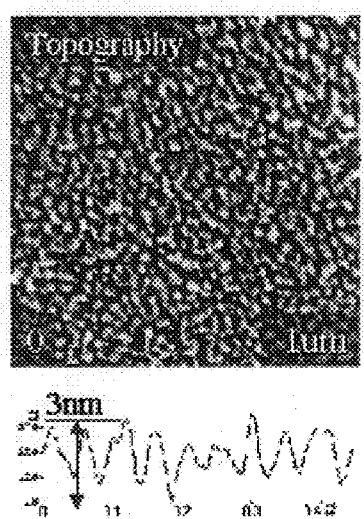
FIG. 7 shows an atomic force microscope (AFM) picture of the surface of an $SiO_2$ substrate after a source electrode and a drain electrode are formed on the $SiO_2$ substrate by a fabricating method according to the present invention, and a graph showing the height profile of the substrate.
Figure 8:
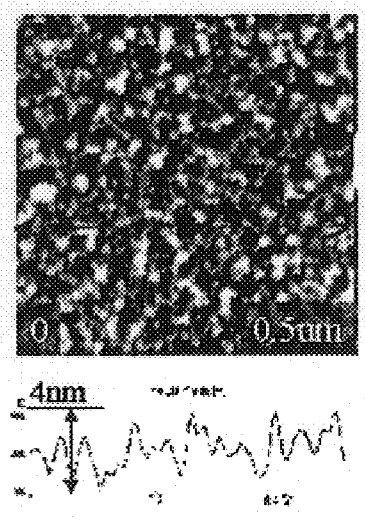
FIG. 8 shows an AFM picture of the surface of a substrate covered with an Au layer having a thickness of about 3.4 nm by a fabricating method according to the present invention, and a graph showing the height profile of the substrate.
Figure 9:
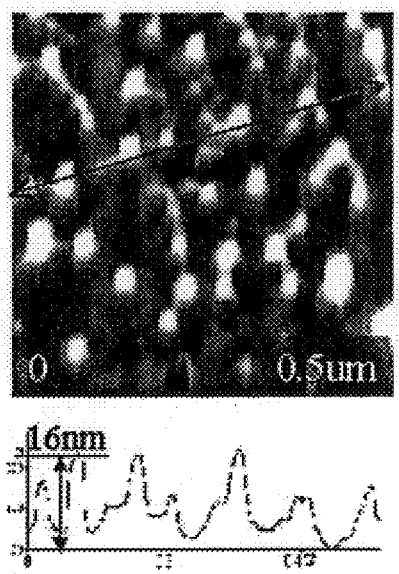
FIG. 9 shows an AFM picture of the surface of a substrate after quantum dots are obtained from the metal layers formed on the substrate, by electromigration (EM), in a fabricating method according to the present invention, and a graph showing the height profile of the formed quantum dots.

FIG. 7 is an atomic force microscope (AFM) picture of the surface of the SiO$_2$ substrate after a source electrode and a drain electrode are formed on the SiO$_2$ substrate. FIG. 8 is an AFM picture of the surface of the substrate covered with an Au layer having a thickness of about 3.4 nm. FIG. 9 shows an AFM picture of the surface of the substrate after quantum dots are produced from the metal layer by EM. The graphs under the pictures of FIGS. 7 through 9 are the height profiles of quantum dots. As can be seen from FIG. 9, quantum dots having a diameter of several tens of nm.

Figure 10:
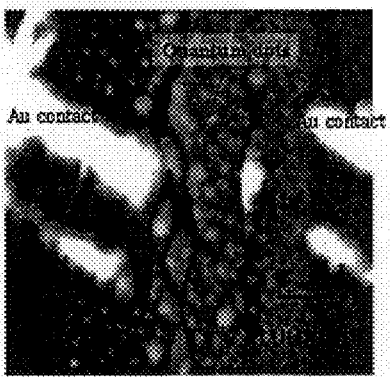
FIG. 10 is an AFM picture of an SET device fabricated by a method according to the present invention.

FIG. 10 is an AFM picture of an SET device fabricated by a method according to the present invention. As can be seen from FIG. 10, hemispherical quantum dots each having a diameter of about 10 to 50 nm are formed between a source and a drain electrode (Au contact). Here, the interval between the source electrode and the drain electrode (Au contact) is about 300 nm.

Figure 11:
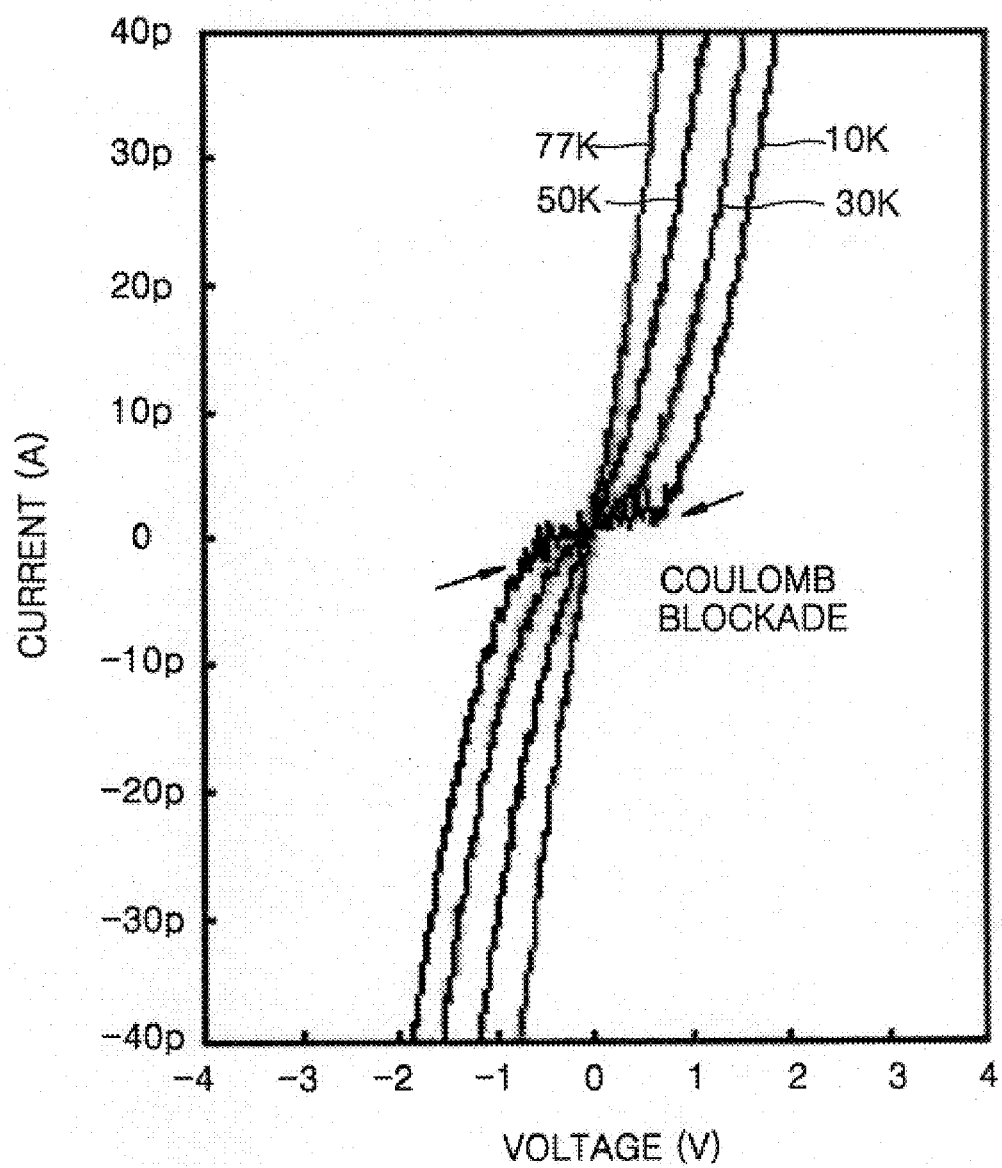
FIG. 11 is a line diagram showing the results of the electrical characteristics (current-to-voltage characteristics or I-V curve) of an SET device fabricated by a method according to the present invention, at four temperatures of 10K, 30K, 50K and 77K.

FIG. 11 is a graph showing the results of the electrical characteristics (current-to-voltage characteristics or I-V curve) of an SET device fabricated by a method according to the present invention, at four temperatures of 10K, 30K, 50K and 77K The I-V curve obtained at a temperature of 10K represents coulomb blockade, which is a peculiar characteristic of an SET device. This proves that hemispherical dots formed by a method according to the present invention are quantum dots.

According to the present invention as described above, in the manufacture of an SET device, quantum dots can be formed by a simple method instead of an SAM method or lithographic methods. Thus, SET devices fabricated by a method according to the present invention have no material dependency, and are also applicable to LSI structures. Also, since quantum dots are obtained by deposition and EM, SET devices having the above-described advantages can be mass-produced.

Although the invention has been described with reference to a particular embodiment, it will be apparent to one of ordinary skill in the art that modifications of the described embodiment may be made without departing from the spirit and scope of the invention.

What is claimed is:

1. A method of fabricating a single electron tunneling (SET) device, the method comprising:

forming a source electrode and a drain electrode a predetermined distance apart from each other on an insulating substrate;

forming a metal layer having a thickness on the order of nanometers between the source and drain electrodes; and forming quantum dots between the source and drain electrodes due to the movement of metal atoms/ions within the metal layer caused by applying a predetermined voltage to the source and drain electrodes.

2. The method of claim 1, wherein the thickness of each of the source and drain electrodes is about 30 to 40 nm.

3. The method of claim 1, wherein the metal layers include tiny islands in a grain state.

4. The method of claim 2, wherein the metal layers include tiny islands in a grain state.

* * * * *